(12) United States Patent
Schreier et al.

(10) Patent No.: US 7,439,890 B2
(45) Date of Patent: Oct. 21, 2008

(54) ΔΣ ANALOG TO DIGITAL CONVERTER SYSTEM WITH AUTOMATIC GAIN CONTROL RESPONSIVE TO OUT-OF-BAND INTERFERERS

(75) Inventors: Richard E. Schreier, Andover, MA (US); Hassan L'Bahy, Leominster, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/497,980

(22) Filed: Aug. 2, 2006

(65) Prior Publication Data

US 2007/0035430 A1  Feb. 15, 2007

Related U.S. Application Data

(60) Provisional application No. 60/706,671, filed on Aug. 9, 2005, provisional application No. 60/706,670, filed on Aug. 9, 2005.

(51) Int. Cl.
*H03M 3/00* (2006.01)
(52) U.S. Cl. ....................... 341/143; 341/144
(58) Field of Classification Search ............... 341/143, 341/144, 139; 455/252.1, 234.1, 232.1, 240.1
See application file for complete search history.

(56) References Cited

U.S. PATENT DOCUMENTS

| | | | | |
|---|---|---|---|---|
| 5,905,453 A | * | 5/1999 | Kase | 341/143 |
| 6,445,320 B1 | * | 9/2002 | Noro et al. | 341/139 |
| 6,968,166 B2 | * | 11/2005 | Yang | 455/234.1 |

OTHER PUBLICATIONS

Dorrer et al., A 3mW 74-db SNR 2-MHz Continuous-Time Delta-Sigma ADC with a Tracking ADC Quantizer in 0.13-μm CMOS, IEEE Journal of Solid-State Circuits, vol. 40, No. 12 Dec. 2005, pp. 2416-2427.
Chao et al., A higher Order Topology For Interpolative Modulators for Oversampling A/D Converters, IEEE Transactions on Circuits and Systems, vol. 37, No. 3, Mar. 1990, pp. 309-318.
Richard Schreier, Delta Sigma Toolbox, Version 5.2, Jun. 7, 2000, pp. 1-25.

* cited by examiner

*Primary Examiner*—Jean B Jeanglaude
*Assistant Examiner*—Joseph Lauture
(74) *Attorney, Agent, or Firm*—Iandiorio Teska & Coleman

(57) ABSTRACT

An improved ΔΣ analog to digital converter system with automatic gain control response to out-of-band interferers including a ΔΣ multibit analog to digital converter responsive to an analog input for providing a digital output including the in-band signal and out-of-band interferers and quantization noise and a signal peak estimator circuit responsive to the out-of-band interferers for generating a gain control signal for adjusting the gain of a variable gain element which may be an independent element such as a variable gain amplifier or it may be the analog to digital converter itself by virtue of its having an adjustable full-scale.

10 Claims, 4 Drawing Sheets

Input and output waveforms for a ΔΣ ADC with $\|H\|_\infty = 8$.

Filtered Output of a ΔΣ ADC.

Input and output waveforms for a ΔΣ ADC with $\|H\|_\infty = 4$.

ΔΣ ANALOG TO DIGITAL CONVERTER SYSTEM WITH AUTOMATIC GAIN CONTROL RESPONSIVE TO OUT-OF-BAND INTERFERERS

RELATED APPLICATIONS

This application claims benefit of U.S. Provisional Application Ser. No. 60/706,671 filed Aug. 9, 2005 and U.S. Provisional Application Ser. No. 60/706,670 filed Aug. 9, 2005. This application is incorporated herein by this reference.

FIELD OF THE INVENTION

This invention relates to an improved ΔΣ analog to digital converter system with automatic gain control responsive to out-of-band interferers.

BACKGROUND OF THE INVENTION

Delta Sigma (ΔΣ) analog to digital converters are used for high-fidelity conversion of analog signals into digital form. In the context of many signal chains, especially those associated with communications systems, the analog to digital converter forms one of the components in an automatic gain control (AGC) loop. The digital output of the ΔΣ converter is processed by a digital block which controls the gain of the loop such that the various signal processing elements in the loop are operating properly. There may be one or several variable gain elements in the loop including the analog to digital converter itself where its full-scale is adjustable.

Filtering (which often includes decimation) is generally needed in order to properly measure the signal level. This is so because the output of a ΔΣ converter differs markedly from its input on an instant-by-instant basis due to the large amount of quantization noise that is present in the converter's output. This large discrepancy corrupts the signal-strength estimation process, necessitating the use of filtering.

However, filtering has its own drawbacks. One problem with filtering is that it removes both quantization noise and interferer signals. If the interferer signals dominate the signal strength, then the signal-strength estimate will be in error. Thus, using a filter that is narrow enough to eliminate all out-of-band noise (and hence all out-of-band signals) can result in a signal-strength estimate which is too low. This low estimate will cause the gain of the variable gain element to be set too high, possibly so high that the out-of-band signals overload the analog to digital converter. Another problem with filtering is that it takes time and thus limits the speed of the automatic gain control loop.

SUMMARY OF THE INVENTION

It is therefore an object of this invention to provide an improved ΔΣ analog to digital converter system with automatic gain control responsive to out-of-band interferers.

It is a further object of this invention to provide such an improved ΔΣ analog to digital converter system with automatic gain control responsive to out-of-band interferers which performs signal strength estimation without the need for filtering quantization noise and so passes out-of-band interferers.

It is a further object of this invention to provide such an improved ΔΣ analog to digital converter system with automatic gain control responsive to out-of-band interferers which use an all-digital implementation of the automatic gain control circuit.

It is a further object of this invention to provide an improved ΔΣ analog to digital converter system with automatic gain control responsive to out-of-band interferers which inherently accounts for the signal transfer function of the analog to digital converter.

It is a further object of this invention to provide an improved ΔΣ analog to digital converter system with automatic gain control responsive to out-of-band interferers which provides more appropriate gain control using peak rather then average values.

The invention results from the realization that an improved ΔΣ analog to digital converter system with automatic gain control responsive to out-of-band interferers can be achieved with a ΔΣ analog to digital converter responsive to the variable gain element for providing an unfiltered digital output from the analog input signal; the digital output including the in-band signal and out-of-band interferers and quantization noise; and a signal peak estimator circuit responsive to the unfiltered out-of-band interferers for generating a gain control signal for adjusting the gain of the variable gain element.

The subject invention, however, in other embodiments, need not achieve all these objectives and the claims hereof should not be limited to structures or methods capable of achieving these objectives.

This invention features an improved ΔΣ analog to digital converter system with automatic gain control response to out-of-band interferers including a variable gain element for receiving an analog input signal and a multibit ΔΣ analog to digital converter responsive to the variable gain element for providing a digital output from the analog input signal. The digital output includes unfiltered in-band signals and out-of-band interferers and quantization noise. A signal peak estimator circuit responsive to the unfiltered out-of-band interferers generates a gain control signal for adjusting the gain of the variable gain element.

In a preferred embodiment the variable gain element may be included in the analog to digital converter. The signal peak estimator circuit may also be responsive to the unfiltered in-band signals. The signal peak estimator circuit may include an absolute value circuit, a differencing circuit for determining the difference between the output of the absolute value circuit and the output of the signal peak estimator circuit, a comparator circuit responsive to the differencing circuit for indicating whether the output of the signal peak estimating circuit is greater than or lesser than the output of the absolute value circuit and a non-linear mapping circuit responsive to the comparator circuit for increasing the output of the signal peak estimator circuit at a first rate in the former condition and decreasing the output of the signal peak estimator circuit at a second rate in the latter condition. The first rate may be faster than the second rate.

The invention also features an improved ΔΣ analog to digital converter system with automatic gain control responsive to out-of-band interferers including a ΔΣ multibit analog to digital converter, with an adjustable full-scale, responsive to an analog input for providing an unfiltered digital output including the in-band signal and out-of-band interferers and quantization noise. There is a signal peak estimator circuit responsive to the unfiltered out-of-band interferers for generating a gain control signal for adjusting the full-scale of the analog to digital converter.

In a preferred embodiment the signal peak estimator circuit may also respond to the unfiltered in-band noise. The signal peak estimator circuit may include an absolute value circuit, a differencing circuit for determining the difference between the output of the absolute value circuit and the output of the signal peak estimator circuit, a comparator circuit responsive to the differencing circuit for indicating whether the output of the signal peak estimator circuit is greater than or lesser than the output of the absolute value circuit, and a non-linear mapping circuit responsive to the comparator circuit for increasing the output of the signal peak estimator circuit at a first rate in the former condition and decreasing the output of the signal peak estimator circuit at a second rate in the latter condition. The first rate may be faster than the second rate. The ΔΣ analog to digital converter may have a noise transfer function in which the analog to digital converter has an out-of-band gain of less than six.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
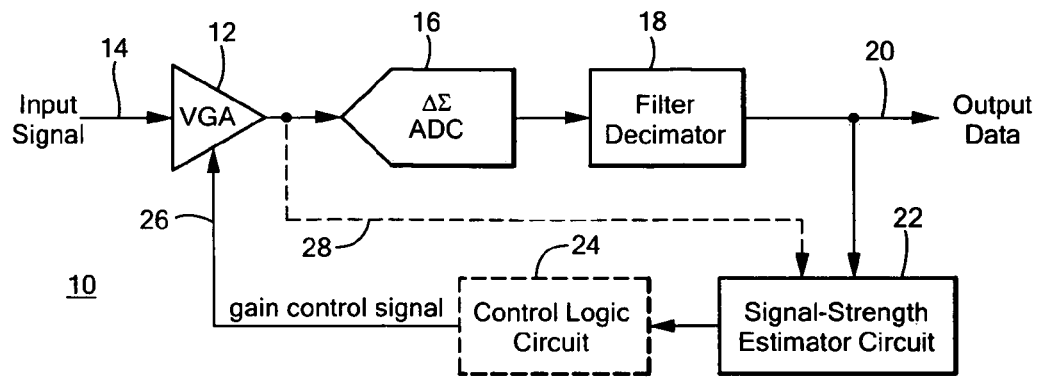
FIG. 1 is a schematic block diagram of a prior art automatic gain control circuit with a ΔΣ analog to digital converter.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 a ΔΣ analog to digital converter system with an automatic gain control loop 10 including a variable gain amplifier 12 which delivers input signal 14 to ΔΣ analog to digital converter 16. The digital output of analog to digital converter 16 is delivered to filter/decimator 18, which provides the output data 20. That same output data signal 20 is delivered to signal strength estimator circuit 22, which typically uses an average or RMS value to estimate the signal strength. Typically the control logic circuit 24 conditions and scales the signal to provide the proper gain control signal 26 to adjust the gain of variable gain amplifier 12. Although only one variable gain amplifier 12 is shown in FIG. 1 two or more may be used. Alternatively there may be no discreet variable gain amplifiers used: the ΔΣ analog to digital converter 16 may itself perform the gain control function by virtue of having an adjustable full-scale.

In some such prior art devices the signal strength estimator circuit 22, instead of monitoring the output 20 actually monitors the analog input to analog to digital converter 16 such as over line 28. Using that implementation results in a departure from an all digital implementation such as when filter/decimator 18 signal strength estimator circuit 22 and control logic circuit 24 are used providing an all digital block for controlling the gain. In addition using the analog input before it is delivered to the analog to digital converter 16 fails to account for the signal transfer function of the analog to digital converter itself.

Figure 2:
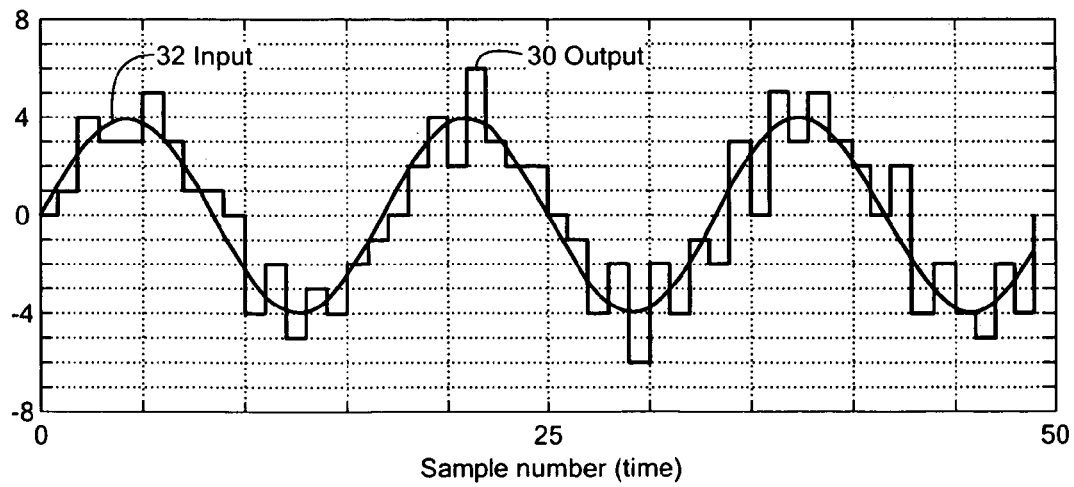
FIG. 2 illustrates input and output waveforms for a ΔΣ analog to digital converter with an out-of-band gain $|H|_\infty$ of 8.

In FIG. 1 filtering such as filter/decimator 18 is needed in order to properly measure the signal level. This can be seen in FIG. 2 where the output 30 of a third order multibit ΔΣ analog to digital converter is compared to its analog input 32. The output 30 and input 32 are for a ΔΣ analog to digital converter having an out-of-band gain of $|H|_\infty$=8. In this case the output 30 of the converter is seen to differ markedly from its analog input 32 on an instant by instant basis due to the large amount of quantization noise that is present in the converter's output. The large discrepancy disrupts the signal strength estimation process necessitating the use of filtering.

Figure 3:
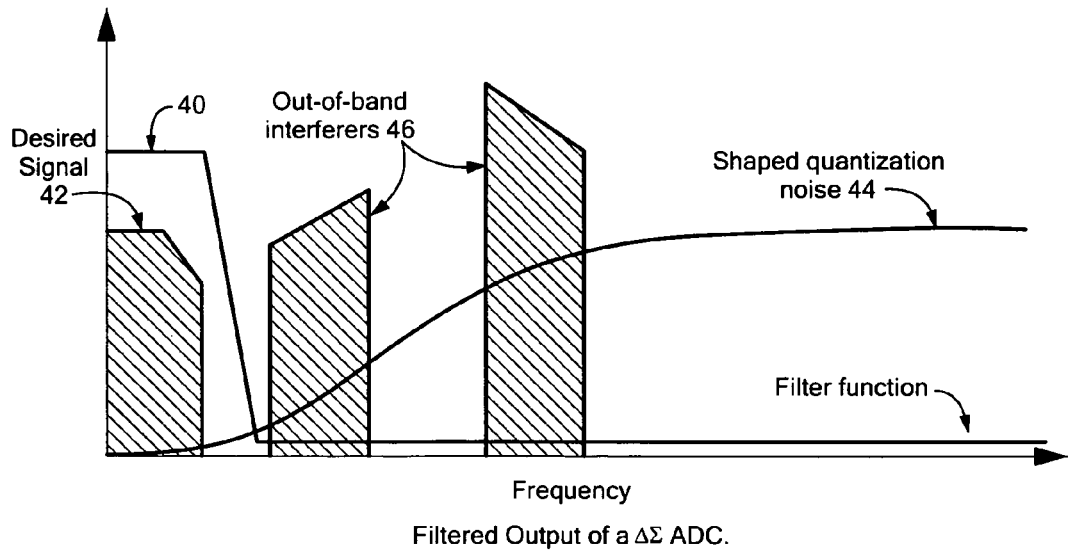
FIG. 3 illustrates a representation in the frequency domain of the desired in-band signal, out-of-band interferers and quantization noise.

However, in this prior art device even filtering does not completely solve the problem as shown in FIG. 3, where the filter function 40 passes the desired signal 42 while blocking the quantization noise 44 and out-of-band interferers 46. In this case where the interferer signals dominate the signal strength, the estimate will be in error. This filter performing as desired performs well in passing the desired signal 42 and blocking the undesirable signals quantization noise 44 and out-of-band interferers 46 but it results in a signal strength estimate which is too low. This low estimate causes the gain of the variable gain amplifier to be set too high or the full-scale of the analog to digital converter to be set too low, possibly causing overload in the analog to digital converter.

Figure 4:
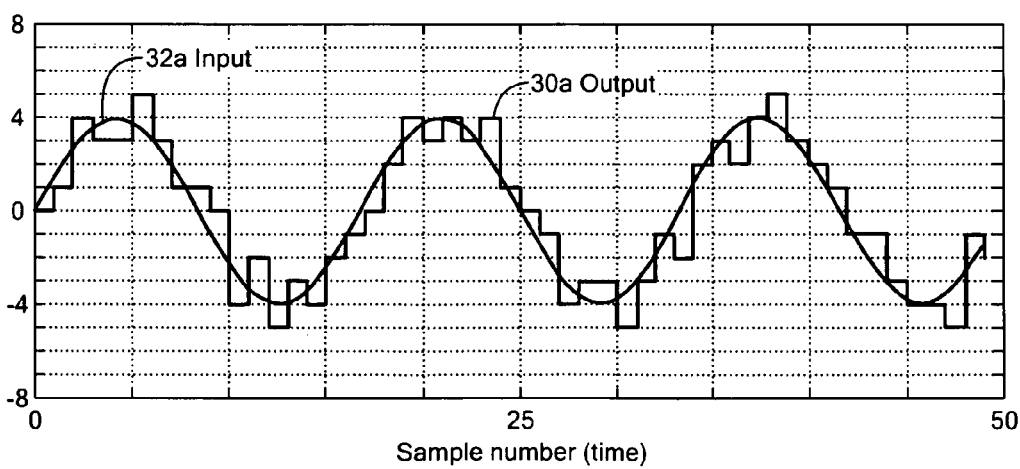
FIG. 4 is a view similar to FIG. 2 with an $|H|_\infty$ of 4.

In accordance with this invention it is beneficial but not a necessary limitation to operate with a lower noise transfer function (NTF) out-of-band gain, e.g. $|H|_\infty$=4, which provides improved results as shown by output 30a, FIG. 4, more closely following input 32a.

Figure 5:
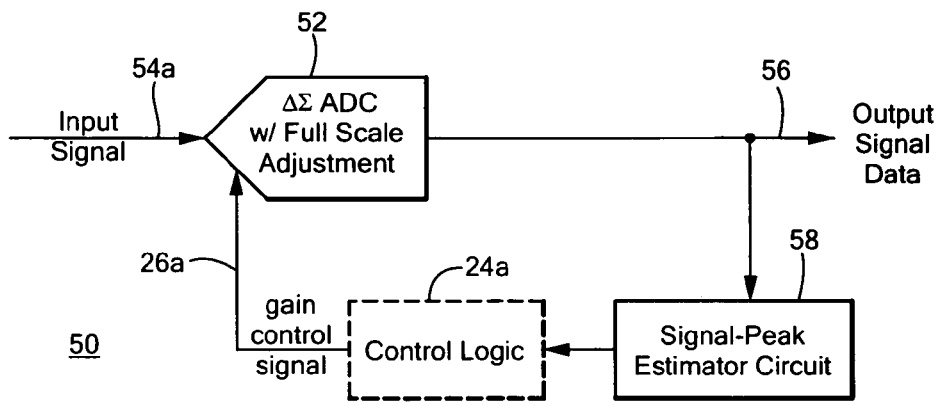
FIG. 5 is a schematic block diagram of an improved ΔΣ analog to digital converter system with automatic gain control responsive to out-of-band interferers according to this invention.

In accordance with this invention an improved ΔΣ analog to digital converter system with automatic gain control responsive to out-of-band interferers 50, FIG. 5, includes a ΔΣ analog to digital converter 52 that receives an analog input signal 54 and provides an unfiltered digital output signal data 56. Signal peak estimator circuit 58 monitors not the average or the RMS value of the output but the peak value. In accordance with this invention it is understood that when the peak-to-average ratio of the incoming signal is large and/or uncertain, it is more desirable to use the peak value of the signal for automatic gain control purposes. The analog to digital converter can overload when the signals peaks exceed a certain threshold. Choosing the signal level based on its RMS value leaves an uncertain amount of headroom. It should be understood that the system will respond to the desired signal if its peaks exceed those of the interferers. The point is that it will respond to the interferers and won't be misled by them.

Figure 6:
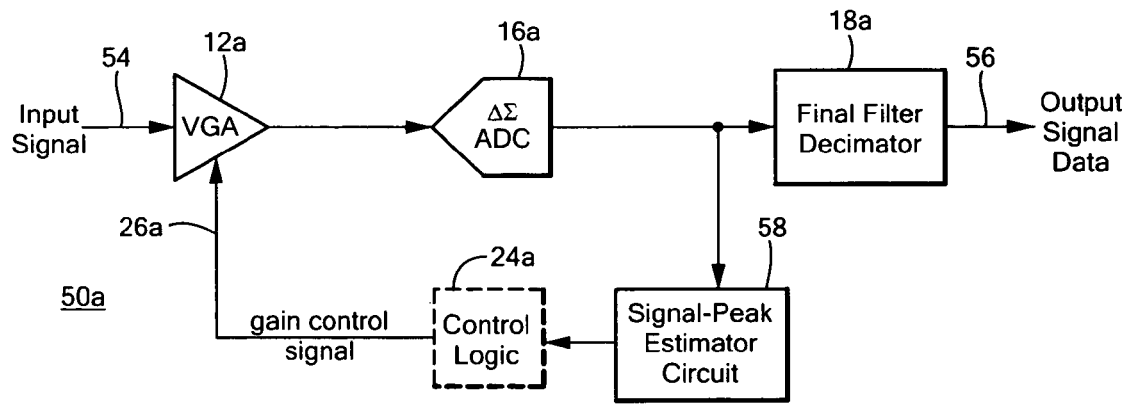
FIG. 6 is an alternative block diagram of an improved ΔΣ analog to digital converter system with automatic gain control responsive to out-of-band interferers according to this invention.

In contrast, in accordance with this invention choosing the signal level based on its peak value results in a more well defined amount of headroom. Thus this invention applies the digital output of the analog to digital converter to a non-linear filter that produces a good estimate of the peak signal level. Thus signal peak estimator circuit 58 relies on the peak signal information and receives its input from the output of analog to digital converter 52 which automatically accounts for the signal transfer function of the analog to digital converter. Analog to digital converter 52 here is shown as one with full-scale adjustment: no separate external variable gain amplifier is used. The gain control signal 26a is fed directly from control logic 24a to adjust full-scale of converter 52. System 50a, FIG. 6, is similar to system 50, FIG. 5, but it once again uses discrete variable gain amplifier 12a. As with system 50, the signal peak estimator circuit 58 in system 50a uses the unfiltered output of the ADC to estimate the peak input of the ADC, including the out-of-band interferers, for more accurately generating gain control signal 26a to adjust the gain of variable gain amplifier 12a or make the full-scale adjustment for analog to digital converter 52 or 16a. An additional advantage of the system according to this invention is that the gain control loop is implemented by a digital block: in FIG. 5 by signal peak estimator circuit 58 and control logic 24a; in FIG. 6 by signal peak estimator 58 and control logic 24a.

Figure 7:
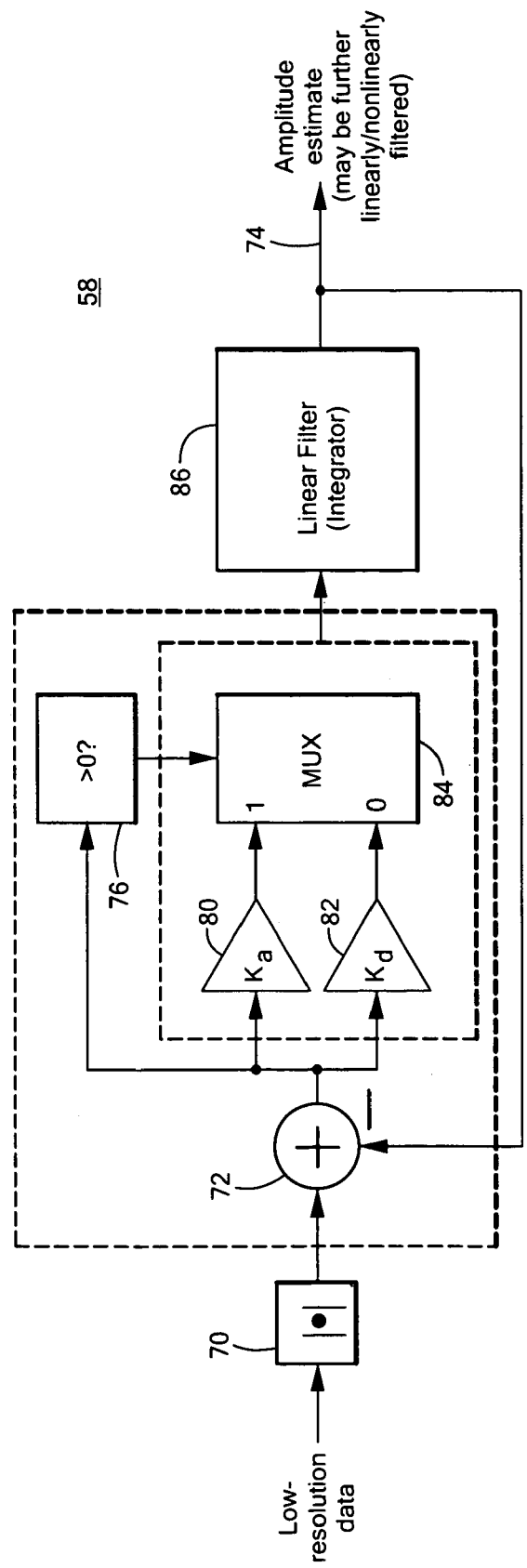
FIG. 7 is a more detailed schematic block diagram of the signal peak estimator circuit of FIGS. 5 and 6.

Signal peak estimator 58, FIG. 7, may include an absolute value circuit 70 that provides one input to differencing circuit 72; the other input is delivered from the output 74 of estimator circuit 58. If the output of the estimator is less than the input from absolute value circuit 70, comparator circuit 76 indicates greater than zero. Conversely, if the output 74 of estimator 58 is greater than the output of the absolute value circuit then comparator circuit 76 indicates less than zero. There is a non-linear mapping circuit 78 which includes two scaling circuits applying different constants: the fast constant 80 and the slower constant 82. There is also included a multiplexor 84.

In operation whether comparator 76 indicates above zero or below, the signal from differencing circuit 72 is fed to both scaling circuits 80 and 82. However, only one under control of comparator 76 will pass through multiplexor 84 to linear filter 86 and finally to the output of the estimator 58 at 74 where the amplitude estimate is provided. If the difference sensed by differencing circuit 72 is greater than zero comparator circuit 76 enables the output of scaling circuit 80 and disables that of scaling circuit 82. Conversely, if comparator circuit 76 senses the difference is less than zero than it disables scaling circuit 80 and enables scaling circuit 82. Typically scaling circuit 80 has a larger gain factor than scaling circuit 82 to provide what is known as a fast attack/slow-decay behavior for the amplitude estimate.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. An improved $\Delta\Sigma$ analog to digital converter system with automatic gain control responsive to out-of-band interferers comprising;
    a variable gain element for receiving an analog input signal;
    a multi-bit $\Delta\Sigma$ analog to digital converter responsive to the variable gain element for providing a digital output from the analog input signal; the digital output including unfiltered in-band signals and out-of-band interferers and quantization noise; and
    a signal peak estimator circuit responsive to said unfiltered out-of-band interferers for generating a gain control signal for adjusting the gain of the variable gain element, the waveform of the output of the system substantially resembling the waveform of the input signal such that no filtering is required and the signal peak estimator circuit can be responsive to out-of-band interferers.

2. The $\Delta\Sigma$ analog to digital converter system of claim 1 in which said variable gain element is included in said analog to digital converter.

3. The $\Delta\Sigma$ analog to digital converter system of claim 1 in which signal peak estimator circuit is also responsive to said unfiltered in-band signals.

4. The $\Delta\Sigma$ analog to digital converter system of claim 1 in which said signal peak estimator circuit includes an absolute value circuit, a differencing circuit for determining the difference between the output of said absolute value circuit and the output of said signal peak estimator circuit; a comparator circuit responsive to said differencing circuit for indicating whether said output of said signal peak estimator circuit is greater than or lesser than said output of said absolute value circuit; and a non-linear mapping circuit responsive to said comparator circuit for increasing the output of said signal peak estimator circuit at a first rate in the former conditions and decreasing the output of signal peak estimator at a second rate in the latter condition.

5. The $\Delta\Sigma$ analog to digital converter system of claim 4 in which said first rate is faster than said second rate.

6. An improved $\Delta\Sigma$ analog to digital converter system with automatic gain control responsive to out-of-band interferers comprising;
    a $\Delta\Sigma$ multibit analog to digital converter with an adjustable full-scale responsive to an analog input, for providing an unfiltered digital output including the in-band signal and out-of band interferer and quantization noise; and
    a signal peak estimator circuit responsive to said unfiltered out-of-band interferers for generating a gain control signal for adjusting the full-scale of said analog to digital converter, the waveform of the output of the system substantially resembling the waveform of the input signal such that no filtering is required and the signal peak estimator circuit can be responsive to out-of-band interferers.

7. The $\Delta\Sigma$ analog to digital converter system of claim 6 in which signal pea estimator circuit is also responsive to said unfiltered in-band signals.

8. The $\Delta\Sigma$ analog to digital converter system of claim 6 in which said signal peak estimator circuit includes an absolute value circuit, differencing circuit for determining the difference between the output of said absolute value circuit and the output of said signal peak estimator circuit; a comparator circuit responsive to said differencing circuit for indicating whether said output of said signal peak estimator circuit is greater than or lesser than said output of said absolute value circuit; and a non-linear mapping circuit responsive to said comparator circuit for increasing the output of said signal peak estimator circuit at a first rate in the former conditions and decreasing the output of signal peak estimator at a second rate in the latter condition.

9. The $\Delta\Sigma$ analog to digital converter system of claim 8 in which said first rate is faster than said second rate.

10. The $\Delta\Sigma$ analog to digital converter system of claim 6 in which said analog to digital converter has an out-of-band gain of less than six.

* * * * *